(12) United States Patent
Lai

(10) Patent No.: US 10,082,256 B2
(45) Date of Patent: *Sep. 25, 2018

(54) METHOD OF MAKING LED LIGHT BULB WITH THERMAL RADIATION FILAMENTS

(71) Applicant: BGT MATERIALS LIMITED, Manchester (GB)

(72) Inventor: Chung-Ping Lai, Hsinchu County (TW)

(73) Assignee: BGT MATERIALS LIMITED, Manchester (GB)

(*) Notice: Subject to any disclaimer, the term of this patent is extended or adjusted under 35 U.S.C. 154(b) by 0 days.

This patent is subject to a terminal disclaimer.

(21) Appl. No.: 15/874,343

(22) Filed: Jan. 18, 2018

(65) Prior Publication Data

US 2018/0156395 A1 Jun. 7, 2018

Related U.S. Application Data

(63) Continuation-in-part of application No. 14/721,021, filed on May 26, 2015, now Pat. No. 9,933,121.

(51) Int. Cl.
*F21K 9/90* (2016.01)
*F21K 9/232* (2016.01)
(Continued)

(52) U.S. Cl.
CPC ........... *F21K 9/90* (2013.01); *F21K 9/232* (2016.08); *F21K 9/237* (2016.08); *F21V 19/0015* (2013.01); *F21V 29/70* (2015.01); *F21V 29/85* (2015.01); *H01L 24/48* (2013.01);

*H01L 25/0753* (2013.01); *H01L 33/502* (2013.01); *H01L 33/62* (2013.01); *H01L 33/641* (2013.01); *F21Y 2115/10* (2016.08);
(Continued)

(58) Field of Classification Search
CPC F21K 9/90; F21K 9/237; F21K 9/232; H05K 1/09; H05K 1/181; H05K 1/028; H05K 3/0052; H05K 1/0209; H05K 2201/10106; F21V 29/85; F21V 19/003; H01L 33/641; H01L 33/507; F21Y 2115/10

See application file for complete search history.

(56) References Cited

U.S. PATENT DOCUMENTS

2010/0085713 A1 4/2010 Balandin et al.
2012/0104435 A1* 5/2012 Lee .................. H01L 33/54
257/98

(Continued)

*Primary Examiner* — Tracie Y Green

(57) ABSTRACT

A method of making a LED light bulb with thermal radiation filaments contains steps of: A. providing a substrate which includes multiple conductive portions formed on two ends of the substrate respectively so as to electrically connect with an electronic circuit; B. molding LED chips, wires, and phosphors on a front face of the substrate so as to produce a LED filament sheet; C. forming a thermal radiation dissipation film on a back face of the substrate before or after producing the LED filament sheet; D. cutting the substrate into the thermal radiation filaments, wherein each of the thermal radiation filaments has a part of the thermal radiation dissipation film, a part of the LED filament sheet, and parts of the multiple conductive portions respectively; and E. fixing the thermal radiation filaments into the LED light bulb.

16 Claims, 17 Drawing Sheets

Graphene Laminate on PET

(51) Int. Cl.
- *F21V 29/70* (2015.01)
- *F21V 29/85* (2015.01)
- *F21K 9/237* (2016.01)
- *F21V 19/00* (2006.01)
- *H01L 25/075* (2006.01)
- *H01L 33/62* (2010.01)
- *H01L 33/50* (2010.01)
- *H01L 33/64* (2010.01)
- *H01L 23/00* (2006.01)
- *F21Y 115/10* (2016.01)

(52) U.S. Cl.
CPC ............... *H01L 2224/48137* (2013.01); *H01L 2924/12041* (2013.01); *H01L 2933/0041* (2013.01); *H01L 2933/0066* (2013.01); *H01L 2933/0075* (2013.01)

(56) References Cited

U.S. PATENT DOCUMENTS

| | | |
|---|---|---|
| 2013/0329366 A1 | 12/2013 | Wang et al. |
| 2014/0211475 A1 | 7/2014 | Hsieh et al. |
| 2014/0224466 A1 | 8/2014 | Lin et al. |

\* cited by examiner

Coating thermal radiation dissipation film on Al

Control Al foil

Coating thermal radiation dissipation film on PET

Control PET foil

METHOD OF MAKING LED LIGHT BULB WITH THERMAL RADIATION FILAMENTS

This application is a Continuation-in-Part of application Ser. No. 14/721,021, filed on May 26, 2015.

BACKGROUND OF THE INVENTION

Field of the Invention

The present invention relates to a method of making LED light bulb, and more particularly to a method of making a LED light bulb with thermal radiation filaments.

Description of the Prior Art

A conventional light bulb is disclosed in US Publication No. 20140211475 and contain: a light-emitting module; a heat-dissipation carrier including a first surface and a second surface opposite to the first surface, disposed under the light-emitting module for conducting heat generated by the light-emitting module away from the light-emitting module; and a heat radiator disposed above the heat-dissipation carrier for radiating heat away from the heat-dissipation carrier, wherein the material of the heat-radiating material coated on the surface of the heat radiator can include carbon-containing compound such as SiC, graphene, metal oxide such as ZnO, or III-nitride compound such as BN. However, as high-power LED bulb is required to generate enough light for illumination purpose rather than direction light, the heat-dissipation design became insufficient so that the heat-dissipation carrier is often enlarged to be bulky metal heat skin, and more effective heat spreading materials are required. The developed thermal management of LED bulb increases the cost of bulbs and the cooling structure is both bulky and heavy that offsets the benefits of LED.

For light bulb application, thermal conductivity only allows heat to be conducted downward to the base. Honestly speaking, this is not efficient because filament will be connected to electronics which generate more heat. Furthermore, the power electronics will be kept in the very tight enclosure like E27/GU10 connector. The heat dissipation is problematic. Graphene has been well-known for its outstanding heat conductivity, and high surface area. Both properties indicate graphene to be a promising candidate of heat-spreading solution. However, relative designs in recent years show several shortages.

US Publication No. 20100085713 proposed lateral graphene as heat spreaders for electronic device and circuits. The integration process, either growing graphene by CVD process or transferring exfoliated graphene, is high cost and fairly complicated, which is not favorable for commercialization. Graphene film/papers are proposed as heat spreaders such as US Publication No. 20130329366 and US Publication No. 20140224466. Graphene films were produced from graphene nanoplatelets. By compression, graphene films were formed. However, the adhesion of films onto heat source or heat sink may create another heat resistance between interfaces, and lower the heat dissipation effect.

The present invention has arisen to mitigate and/or obviate the afore-described disadvantages.

SUMMARY OF THE INVENTION

The primary aspect of the present invention is to provide a method of making a LED light bulb with thermal radiation filaments which removes heat away from a heat source rapidly.

To obtain the above aspect, a method of making a LED light bulb with thermal radiation filaments provided by the present invention contains steps of:

A. providing a substrate which includes multiple conductive portions formed on two ends of the substrate respectively so as to electrically connect with an electronic circuit;

B. molding LED chips, wires, and phosphors on a front face of the substrate so as to produce a LED filament sheet;

C. forming a thermal radiation dissipation film on a back face of the substrate before or after producing the LED filament sheet;

D. cutting the substrate into the thermal radiation filaments, wherein each of the thermal radiation filaments has a part of the thermal radiation dissipation film, a part of the LED filament sheet, and parts of the multiple conductive portions respectively; and E. fixing the thermal radiation filaments into the LED light bulb.

Preferably, in the step B has sub-steps of:

B1. die bonding, wherein the LED chips are die bonded to the front face of the substrate;

B2. wire bonding, wherein the wires are serially connected with the LED chips and are electrically connected with the multiple conductive portions of the substrate respectively so as to form a serial circuit; and B3. forming the phosphors, wherein a phosphor glue is coated on the LED chips so as to form the phosphors on the LED chips.

Preferably, phosphor glue is coated on the LED chips and the wires so that the phosphors cover the LED chips and the wires, and the phosphors do not cover the multiple conductive portions of the substrate.

Preferably, the thermal radiation dissipation film is formed on the back face of the substrate by coating thermal radiation dissipation ink on the back face of the substrate.

Preferably, the thermal radiation dissipation film is formed on the back face of the substrate by adhering the thermal radiation dissipation film on the back face of the substrate, and the thermal radiation dissipation film has an adhesive layer.

Preferably, the adhesive layer is thermally conductive adhesive or thermal tape.

Preferably, the substrate is made any one of metal, ceramic, glass, and plastic.

Preferably, the substrate is made any one of metal, flexible ceramic, flexible glass, and plastic.

Preferably, the thermal radiation filaments are fixed into the LED light bulb and are bent at a curvature or in an arc shape.

Preferably, the thermal radiation dissipation film is formed on the back face of the substrate by coating thermal radiation dissipation ink on the back face of the substrate in any one of a spray coating manner, a brushing manner, a screen printing manner, and a nozzle printing manner, Preferably, the thermal radiation dissipation ink contains dissipation fillers, dispersants, and binders.

Preferably, the dissipation fillers are any one of carbon materials, metal particles, infrared-ray radiation powders, and a mixture of the carbon materials, the metal particles, and the infrared-ray radiation powders.

Preferably, the carbon materials are any one of graphene, carbon black, graphite, carbon nanotubes, activated carbon and a mixture of the graphene, the carbon black, the graphite, the carbon nanotubes, and the activated carbon.

Preferably, the metal particles are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

Preferably, the infrared-ray radiation powders are made of any one of silica ($SiO_2$), alumina ($Al_2O_3$), titanium dioxide ($TiO_2$), zirconia ($ZrO_2$), zirconium carbide (ZrC), silicon Carbide (SiC), tantalum carbide (TaC), titanium diboride ($TiB_2$), zirconium diboride ($ZrB_2$), two titanium silicide ($TiSi_2$), silicon nitride ($Si_3N_4$), titanium nitride (TiN), boron nitride (BN), and a mixture of the $SiO_2$, the $Al_2O_3$, the $TiO_2$, the $ZrO_2$, the ZrC, the SiC, the TaC, the $TiB_2$, the $ZrB_2$, the $TiSi_2$, the $Si_3N_4$, the TiN, and the BN.

BRIEF DESCRIPTION OF THE DRAWINGS

FIG. 6-1 shows a substrate, which is printed circuit board (PCB) in the front side according to the preferred embodiment of the present invention.

FIG. 6-2 shows a substrate, which is printed circuit board (PCB) in the back side according to the preferred embodiment of the present invention.

FIG. 15-1 is a schematic view showing a graphene-based thermal radiation dissipation film being coated on a substrate made of copper according to the preferred embodiment of the present invention.

FIG. 15-2 is a schematic view showing a graphene-based thermal radiation dissipation film being coated on a substrate made of aluminum according to the preferred embodiment of the present invention.

FIG. 15-3 is a schematic view showing a graphene-based thermal radiation dissipation film being coated on substrate made of PET according to the preferred embodiment of the present invention.

DETAILED DESCRIPTION OF THE PREFERRED EMBODIMENTS

Figure 1:
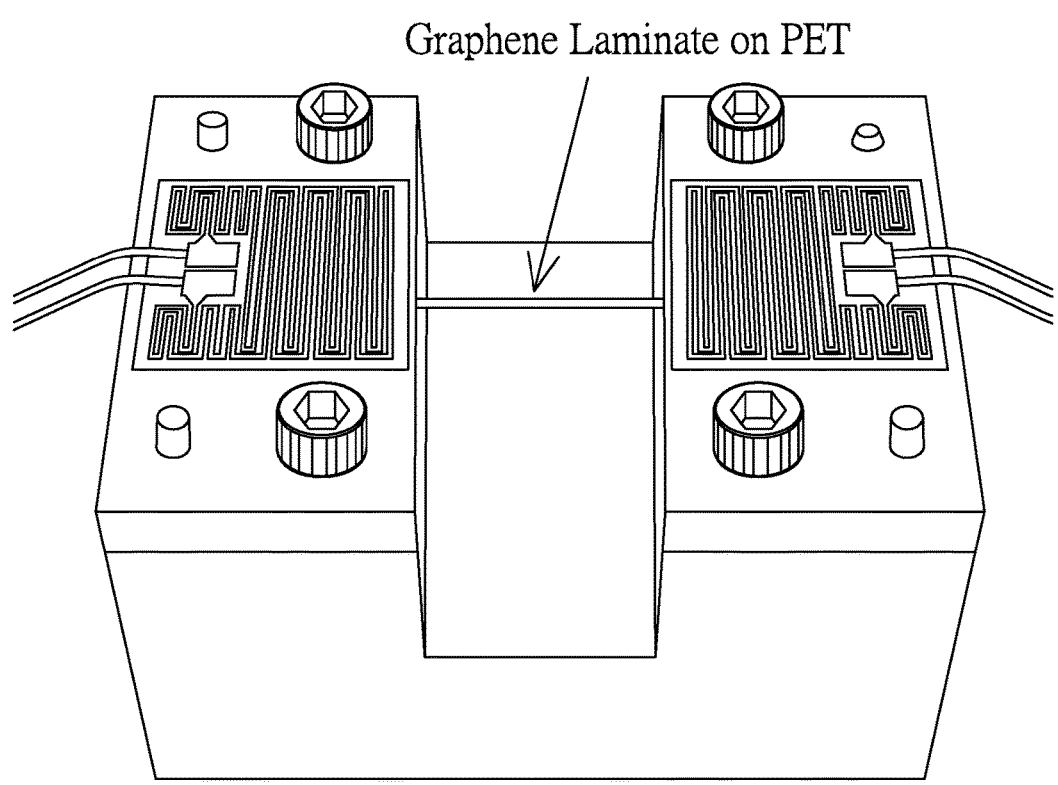
FIG. 1 shows a thermal radiation dissipation film being coated on a polyethylene terephthalate (PET) substrate, and the measurement tool of thermal conductivity.
Figure 2:
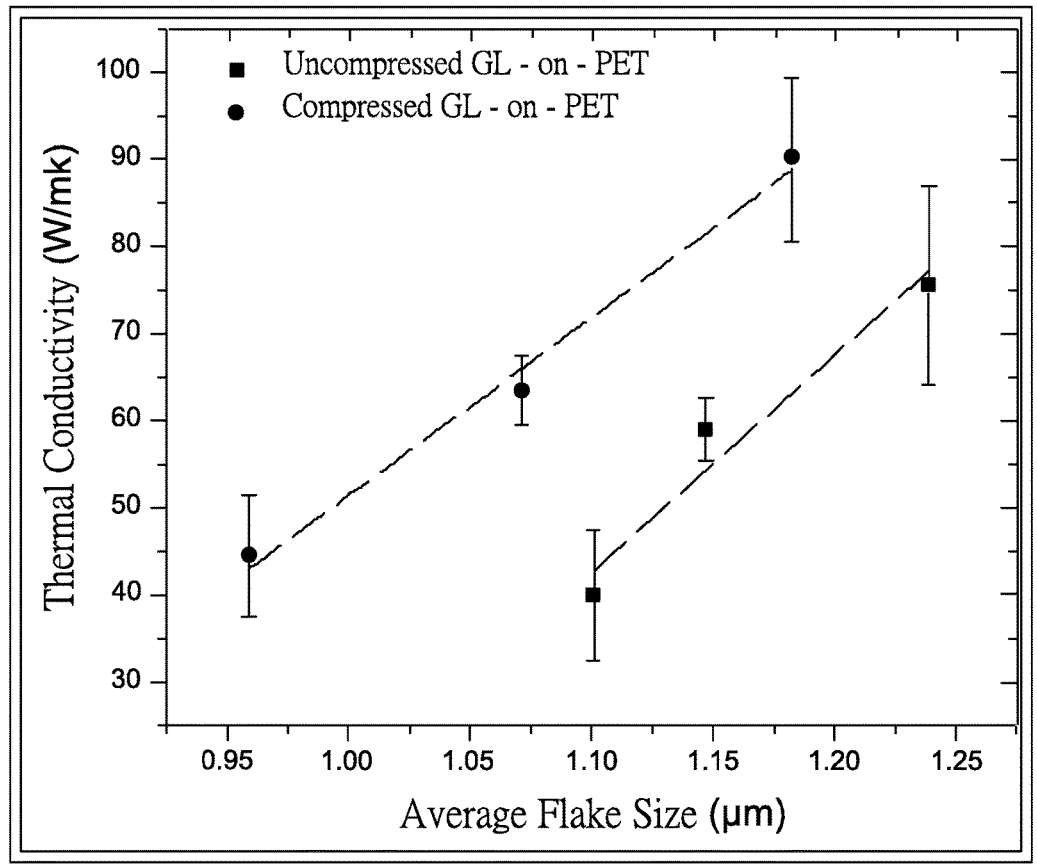
FIG. 2 shows a thermal conductivity of the thermal radiation dissipation film, which is in a range from 40 W/mK to 90 W/mK at room temperature.

With reference to FIGS. 1 to 2, a graphene laminate film is deposited on a polyethylene terephthalate (PET) substrate, and a thermal conductivity of the graphene laminate film is within 40 W/mK to 90 W/mK at a room temperature so as to provide up to 600× higher thermal conductivity than plastics. Thus, a LED light bulb with thermal radiation filaments made by a method of a preferred embodiment of the present invention removes heat away from a heat source rapidly.

Figures 1, 6:
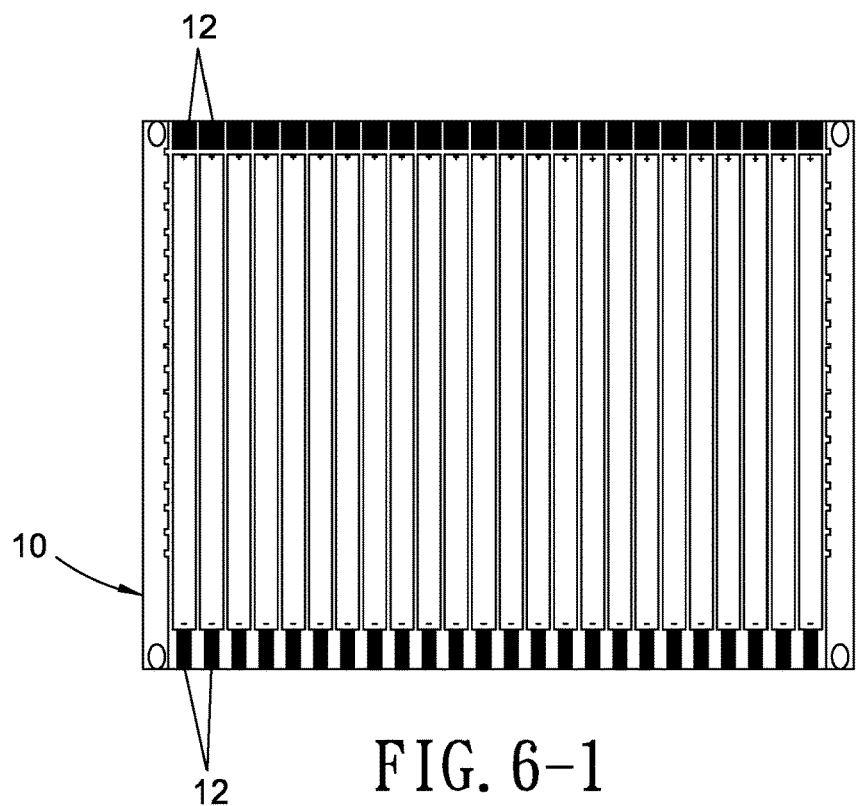
Figures 2, 6:
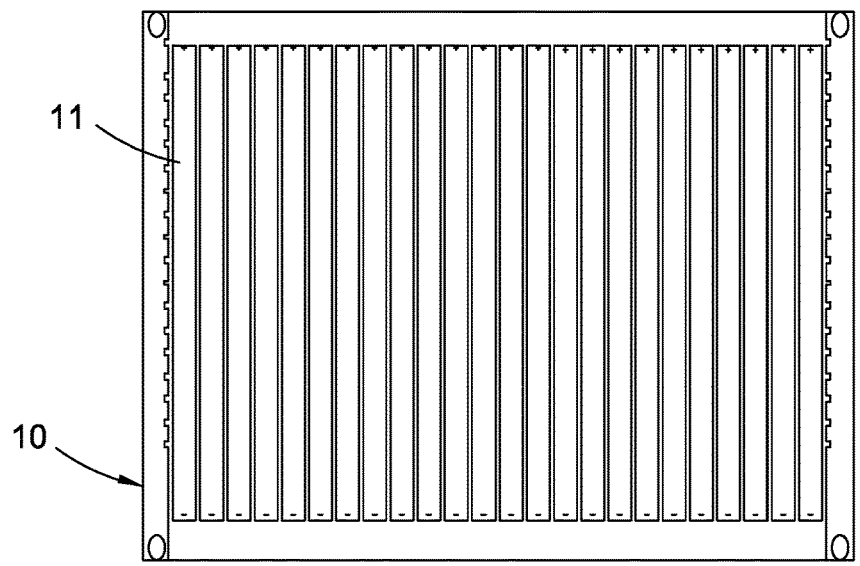
Figure 7:
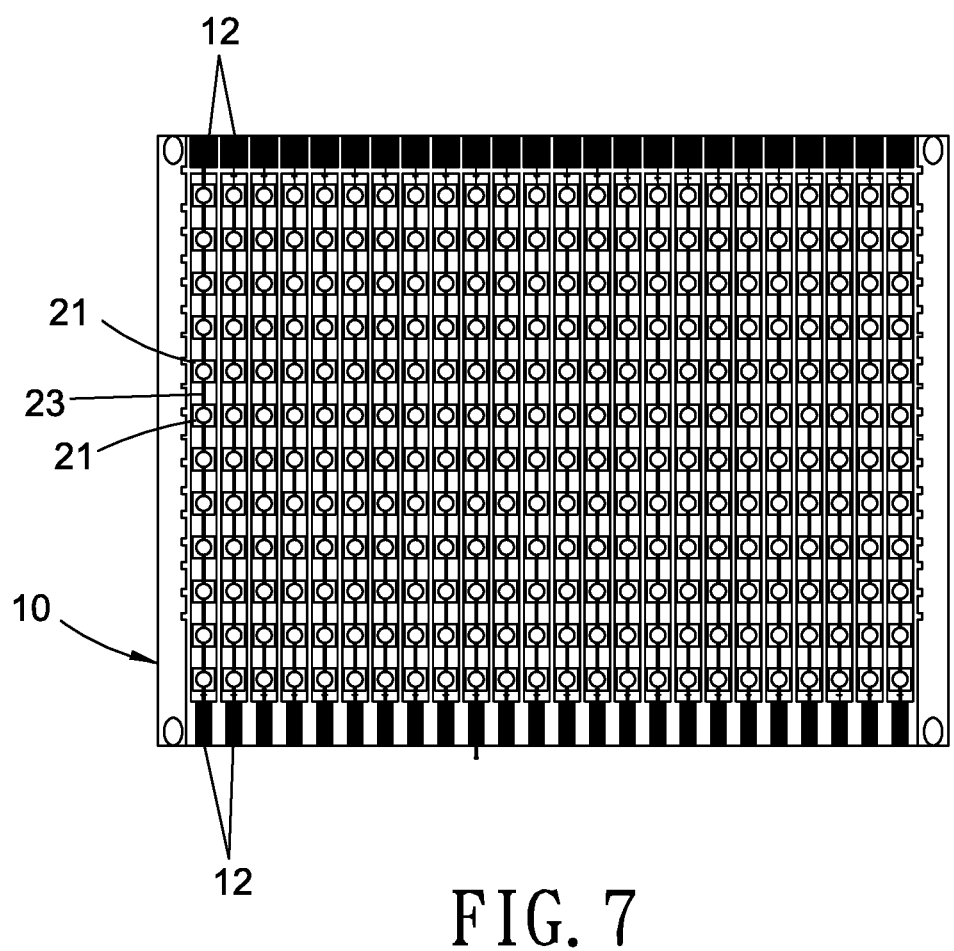
FIGS. 7 to 12 are schematic views showing steps of making the LED light bulb of FIG. 3 according to the preferred embodiment of the present invention.
Figure 8:
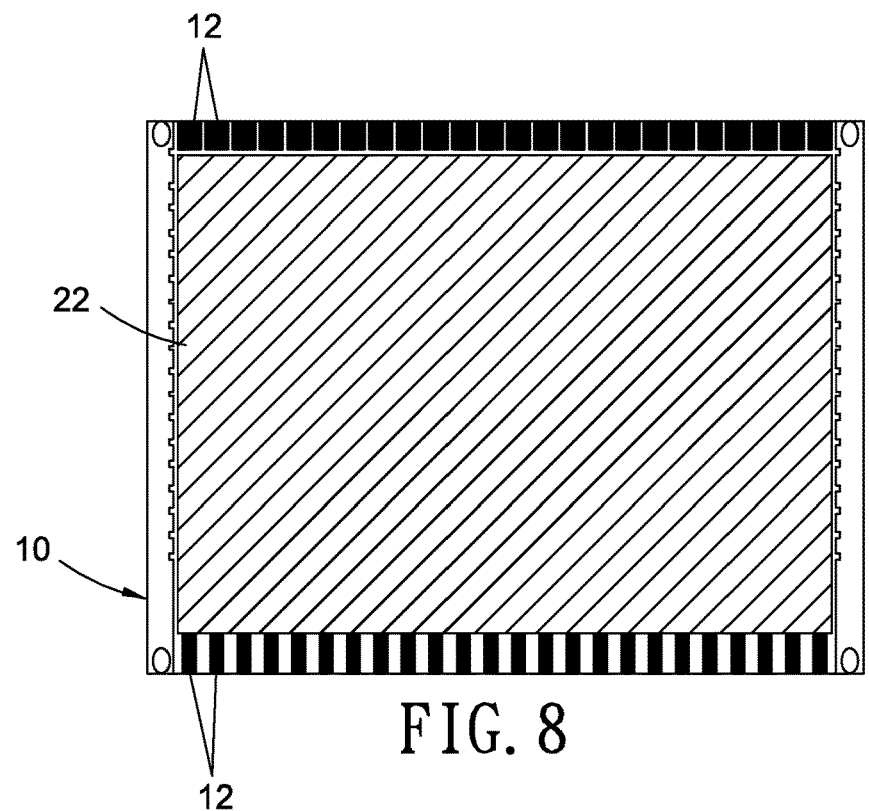
Figure 9:
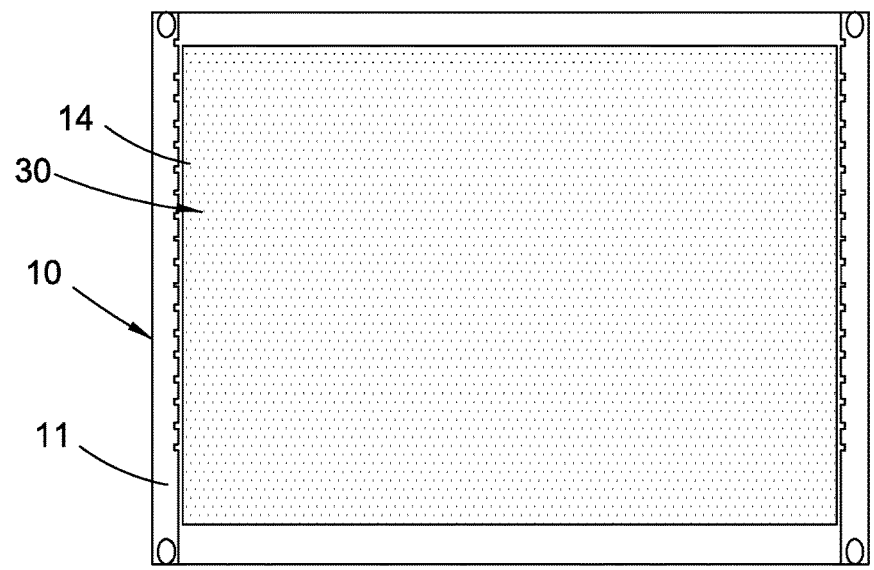
Figure 10:
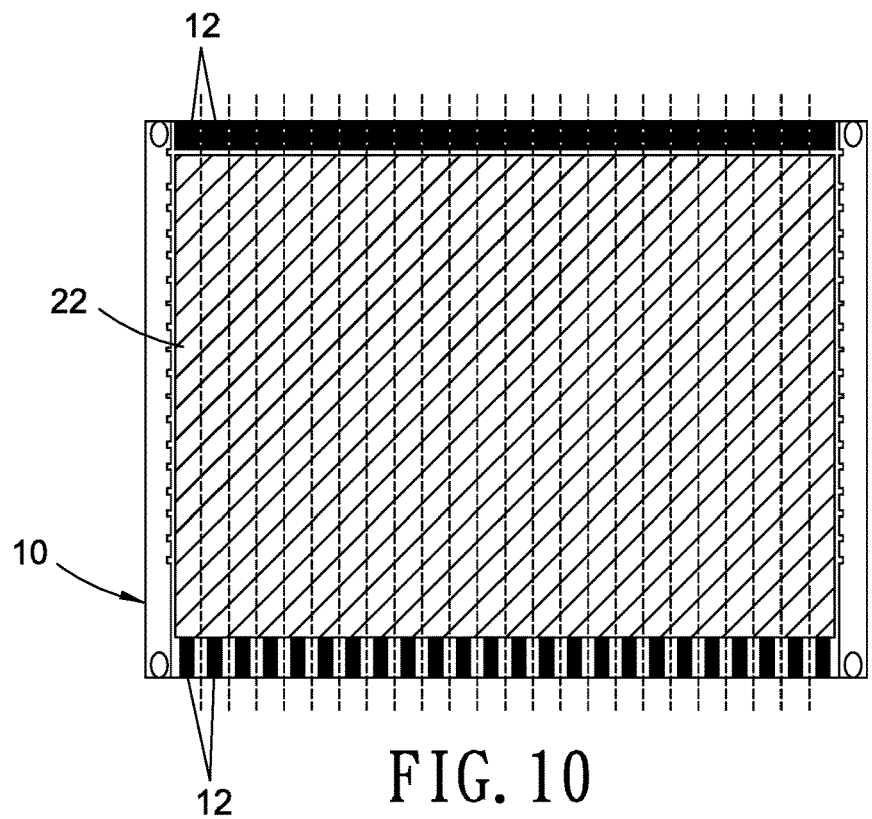
Figure 11:
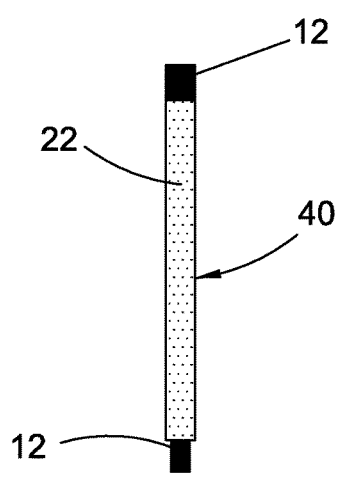
Figure 12:
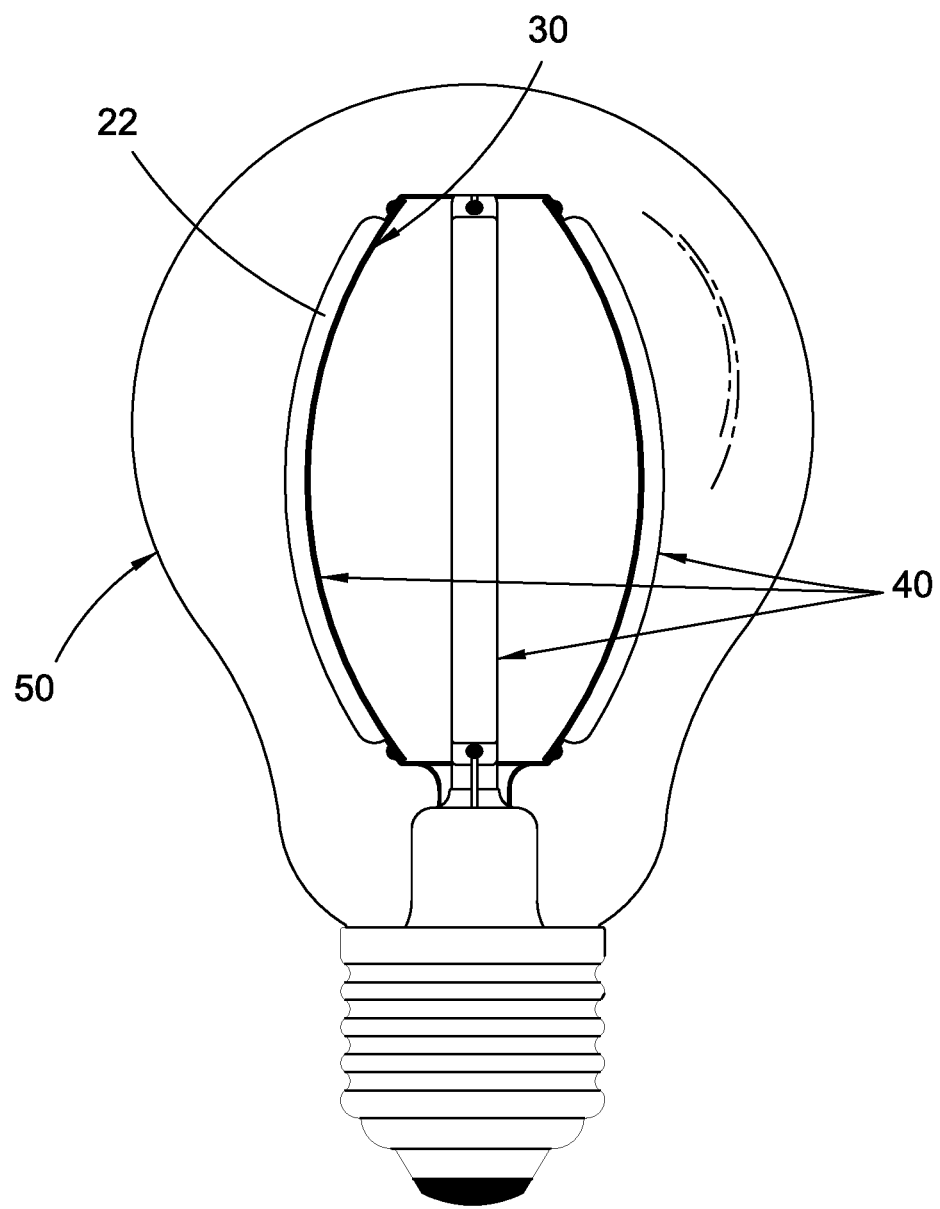

Referring to FIGS. 3, 6-1, 6-2, 7 and 12, a method of making the LED light bulb with the thermal radiation filaments according to the preferred embodiment of the present invention comprising the steps of:

A. providing a substrate 10 which includes multiple conductive portions 12 formed on two ends of the substrate 10 respectively so as to electrically connect with an electronic circuit (as shown in FIG. 6-1), wherein the substrate 10 is made any one of metal, ceramic, glass, and plastic;

B. molding LED chips 21, wires 23, and phosphors 22 on a front face of the substrate 10 so as to produce a LED filament sheet 20 (as shown in FIG. 7 and FIG. 8);

C. forming the thermal radiation dissipation film 30 on a back face 11 of the substrate 10 (as illustrated in FIG. 9) before or after producing the LED filament sheet 20;

D. cutting the substrate 10 (as shown in FIG. 10) into the thermal radiation filaments 40 (as illustrated in FIG. 11), wherein each of the thermal radiation filaments 40 has a part of the thermal radiation dissipation film 30 on a part of the back face 11, a part of the LED filament sheet 20 on a part of the front face of the substrate 10, and parts of the multiple conductive portions 12 on parts of the two ends of the substrate 10 respectively; and E. fixing the thermal radiation filaments 40 into the LED light bulb 50 (as shown in FIG. 12).

Figure 16:
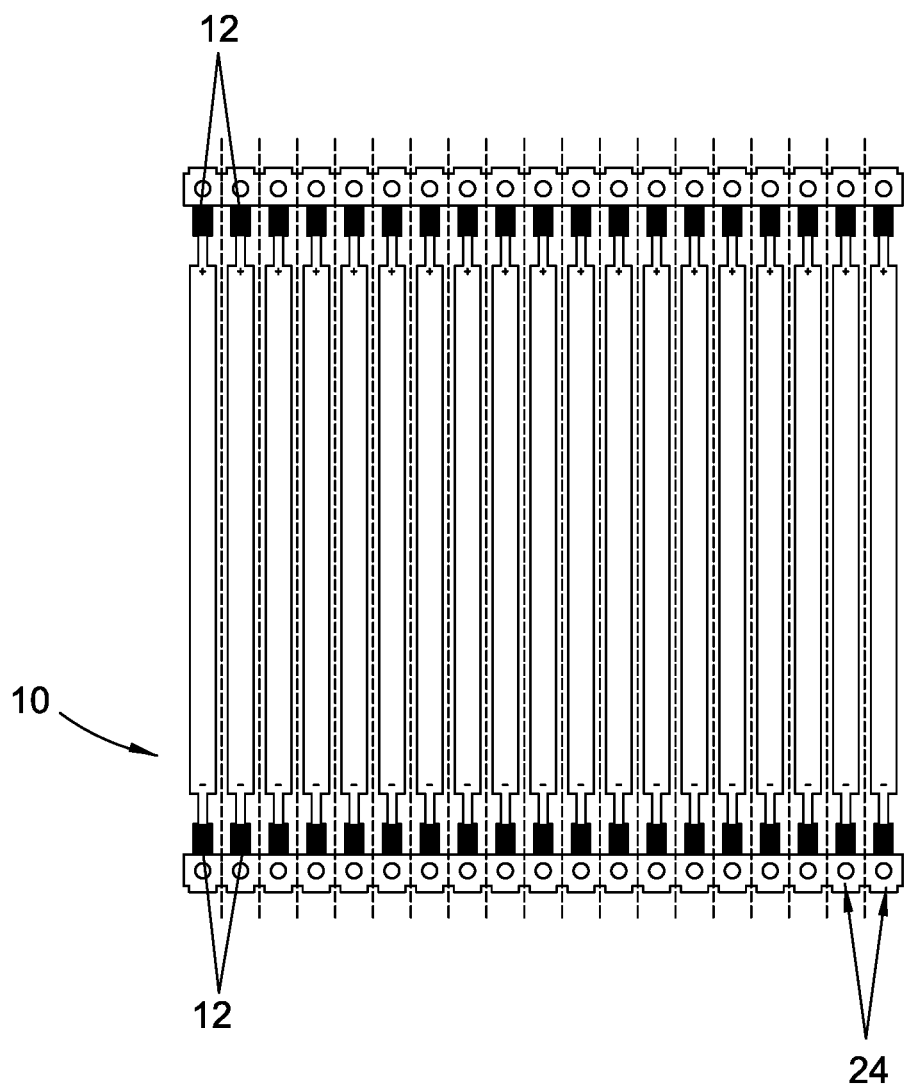
FIG. 16 is a schematic view showing the assembly of a thermal radiation filament according to another preferred embodiment of the present invention.

Referring to FIG. 16, in another preferred embodiment, the LED filament sheet 20 includes multiple bases 24 connected together, wherein each of the multiple bases 24 has a LED chip 21, a wire 23, and phosphors 22 on a front face of each base 24, and the base 24 is cut into thermal radiation filaments 40.

Figure 4:
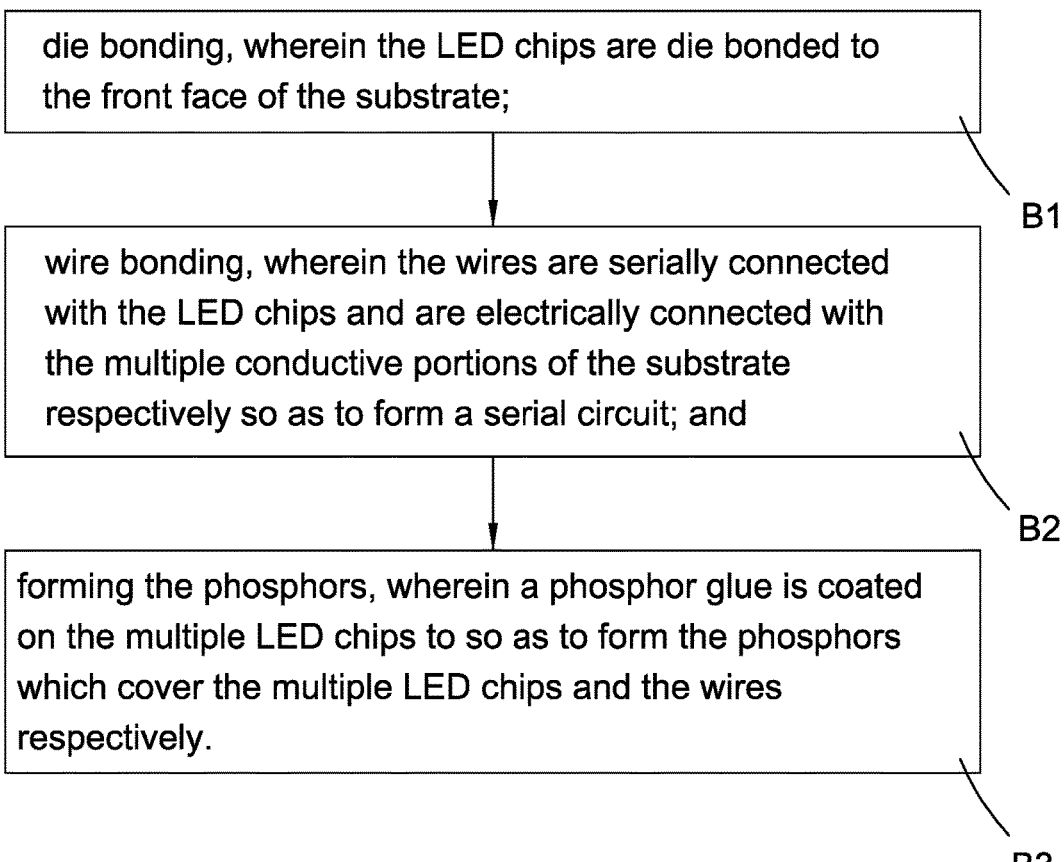
FIG. 4 is a flow chart showing sub-steps of a step of B of the method of the LED bulb with the thermal radiation filaments according to the preferred embodiment of the present invention.
Figure 13:
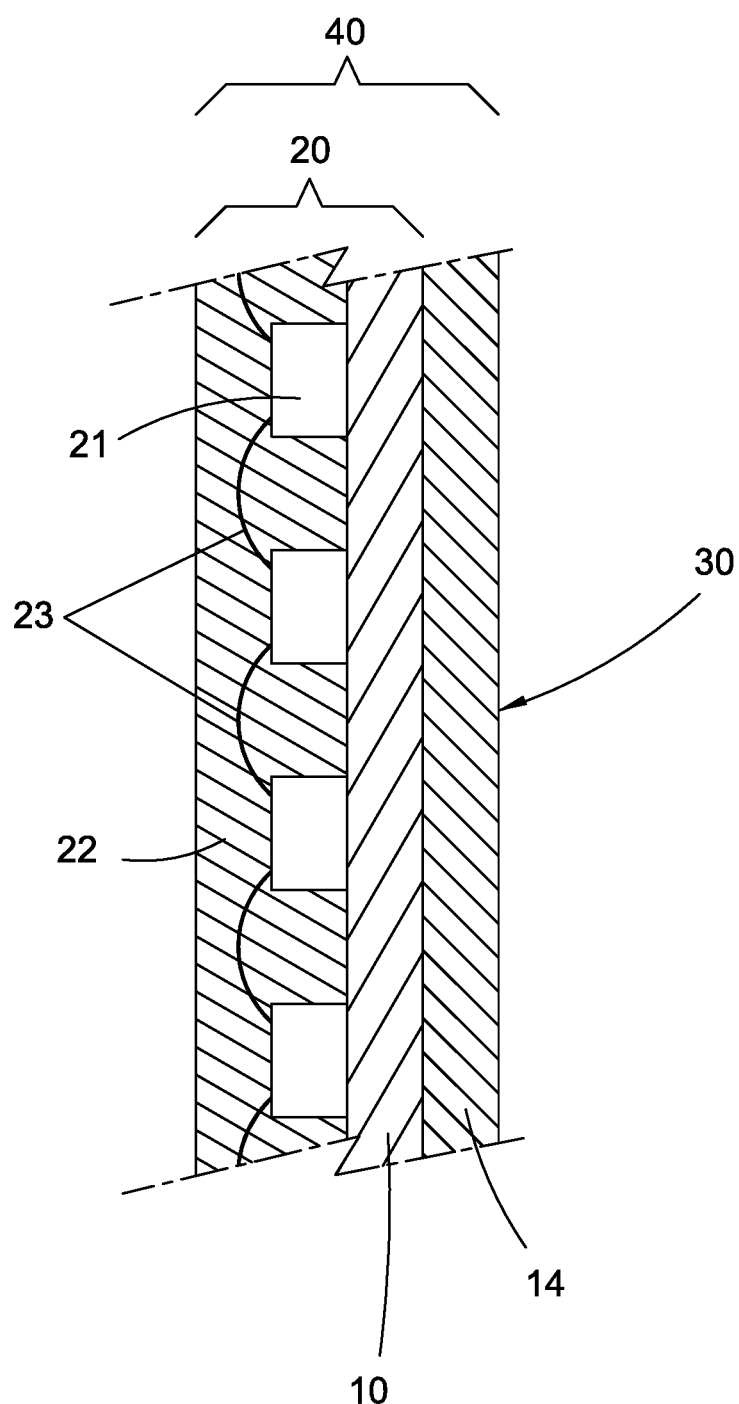
FIG. 13 is a cross sectional view showing the assembly of a thermal radiation filament according to the preferred embodiment of the present invention.

With reference to FIG. 4, the step B has sub-steps of:

B1. die bonding, wherein the LED chips 21 are die bonded to the front face of the substrate 10;

B2. wire bonding, wherein the wires 23 are serially connected with the LED chips 21 and are electrically connected with the multiple conductive portions 12 of the substrate 10 respectively so as to form a serial circuit; and B3. forming the phosphors 22, wherein phosphor glue is coated on the LED chips 21 so as to form the phosphors 22 on the LED chips 21. In another embodiment, the phosphor glue is coated on the LED chips 21 and the wires 23 so that the phosphors 22 cover the LED chips 21 and the wires 23, as illustrated in FIG. 13, and the phosphors 22 do not cover the multiple conductive portions 12 of the substrate 10.

Figure 5:
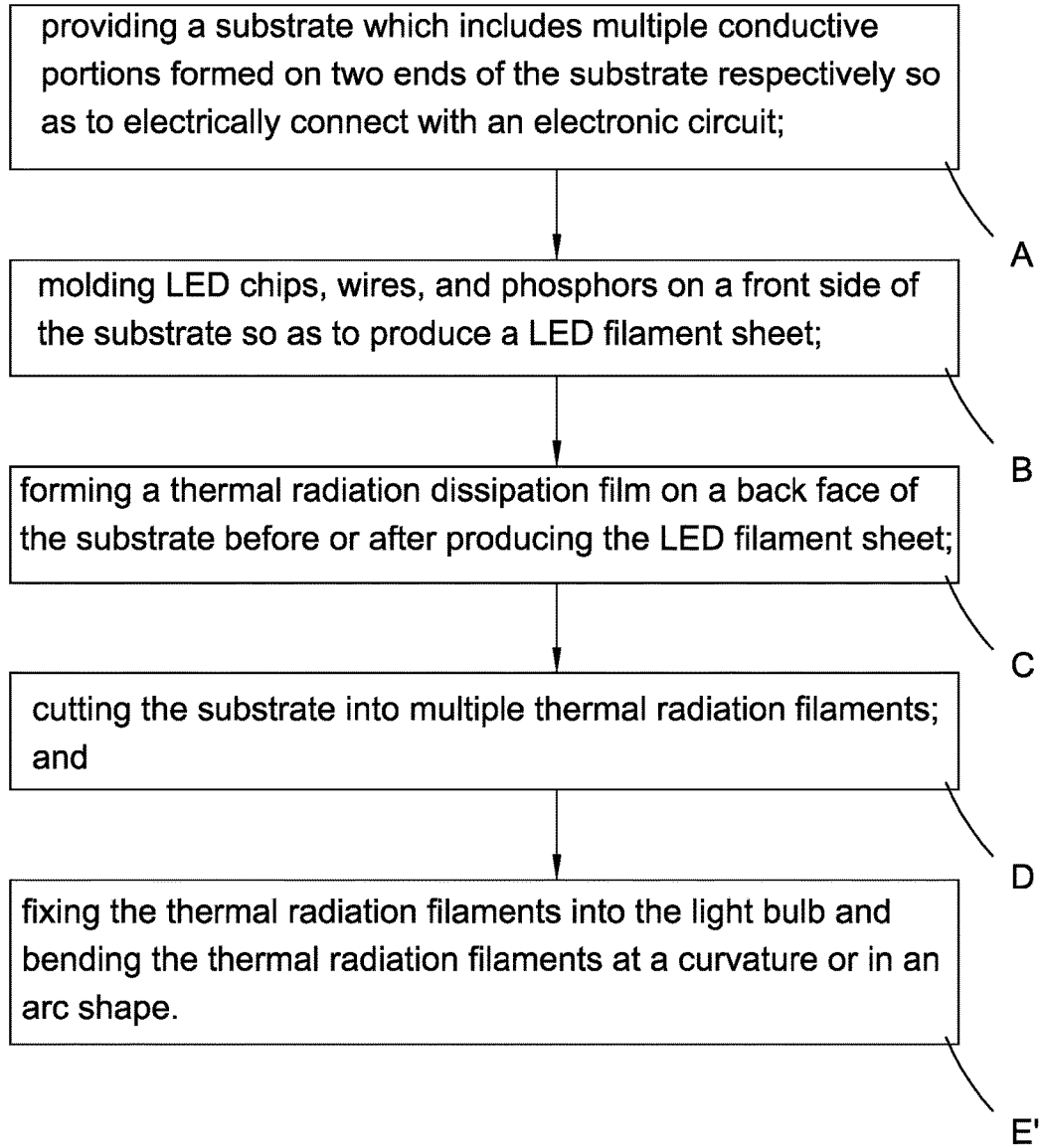
FIG. 5 is a flow chart showing a method of making a LED light bulb with thermal radiation filaments according to another preferred embodiment of the present invention.

With reference to FIG. 5, a method of making a LED light bulb with thermal radiation filaments according to another preferred embodiment of the present invention comprising the steps of:

A. providing a substrate 10 which includes multiple conductive portions 12 formed on two ends of the substrate 10 respectively so as to electrically connect with an electronic circuit, wherein the substrate 10 is made any one of metal, ceramic, glass, and plastic;

B. molding LED chips 21, wires 23, and phosphors 22 on a front face of the substrate 10 so as to produce a LED filament sheet 20 (as shown in FIG. 7 and FIG. 8);

C. forming the thermal radiation dissipation film 30 on a back face 11 of the substrate 10 (as illustrated in FIG. 9) before or after producing the LED filament sheet 20;

D. cutting the substrate 10 (as shown in FIG. 10) into the thermal radiation filaments 40 (as illustrated in FIG. 11), wherein each of the thermal radiation filaments 40 has a part of the thermal radiation dissipation film 30 on a part of the back face 11, a part of the LED filament sheet 20 on a part of the front face of the substrate 10, and parts of the multiple conductive portions 12 on parts of two ends of the substrate 10 respectively; and E'. fixing the thermal radiation filaments 40 into the LED light bulb 50 and bending the thermal radiation filaments 40 at a curvature or in an arc shape.

Preferably, the substrate 10 is made any one of metal, flexible ceramic, flexible glass, and plastic. Thereby, the thermal radiation filaments 40 are curvedly fixed into the LED light bulb 50 based on a shape of the LED light bulb 50.

The thermal radiation dissipation film 30 is formed on the back face 11 of the substrate 10 by coating thermal radiation dissipation ink 14 on the back face 11 of the substrate 10 in any one of a spray coating manner, a brushing manner, a screen printing manner, and a nozzle printing manner, and the thermal radiation dissipation ink 14 is dried so as to form the thermal radiation dissipation film 30.

Figure 14:
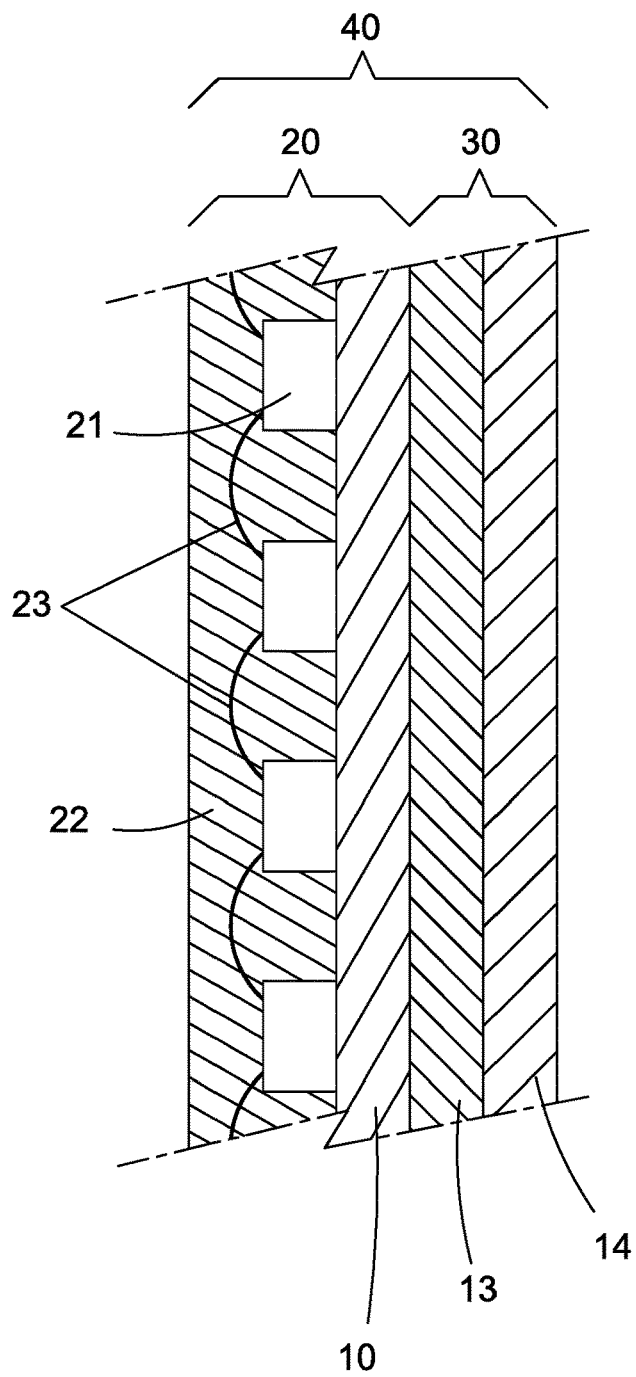
FIG. 14 is another cross sectional view showing the assembly of the thermal radiation filament according to the preferred embodiment of the present invention.

In another embodiment, the thermal radiation dissipation film 30 is formed on the back face 11 of the substrate 10 by adhering the thermal radiation dissipation film 30 on the back face 11 of the substrate 10, wherein the thermal radiation dissipation film 30 has an adhesive layer 13, as shown in FIG. 14, and the adhesive layer 13 is thermally conductive adhesive or thermal tape.

The thermal radiation dissipation ink 14 contains dissipation fillers, dispersants, and binders, wherein the dissipation fillers are any one of carbon materials, metal particles, infrared-ray radiation powders, and a mixture of the carbon materials, the metal particles, and the infrared-ray radiation powders.

The carbon materials are any one of graphene, carbon black, graphite, carbon nanotubes, activated carbon and a mixture of the graphene, the carbon black, the graphite, the carbon nanotubes, and the activated carbon.

The metal particles are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

The infrared-ray radiation powders are made of any one of silica ($SiO_2$), alumina ($Al_2O_3$), titanium dioxide ($TiO_2$), zirconia ($ZrO_2$), zirconium carbide (ZrC), silicon Carbide (SiC), tantalum carbide (TaC), titanium diboride ($TiB_2$), zirconium diboride ($ZrB_2$), two titanium silicide ($TiSi_2$), silicon nitride ($Si_3N_4$), titanium nitride (TiN), boron nitride (BN), and a mixture of the $SiO_2$, the $Al_2O_3$, the $TiO_2$, the $ZrO_2$, the ZrC, the SiC, the TaC, the $TiB_2$, the $ZrB_2$, the $TiSi_2$, the $Si_3N_4$, the TiN, and the BN.

Figure 3:
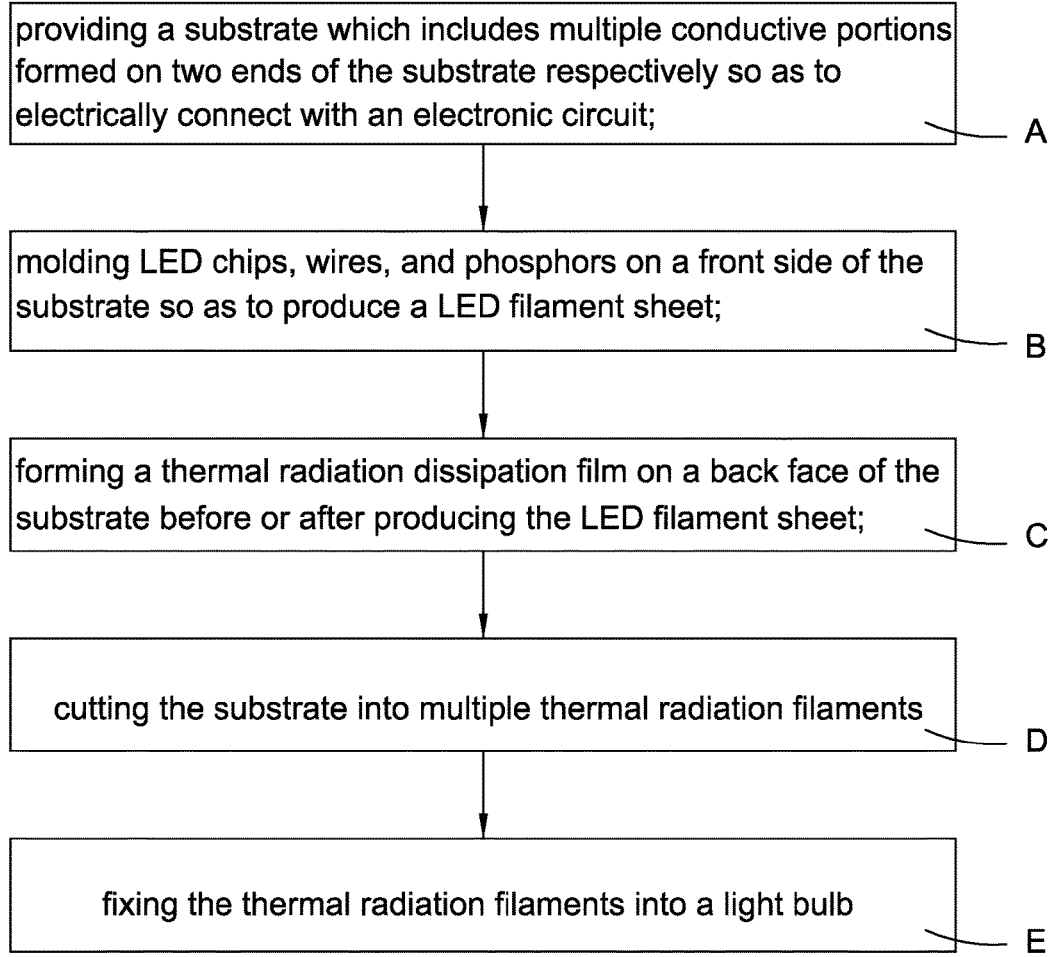
FIG. 3 is a flow chart showing a method of making a LED light bulb with thermal radiation filaments according to a preferred embodiment of the present invention.
Figure 15:
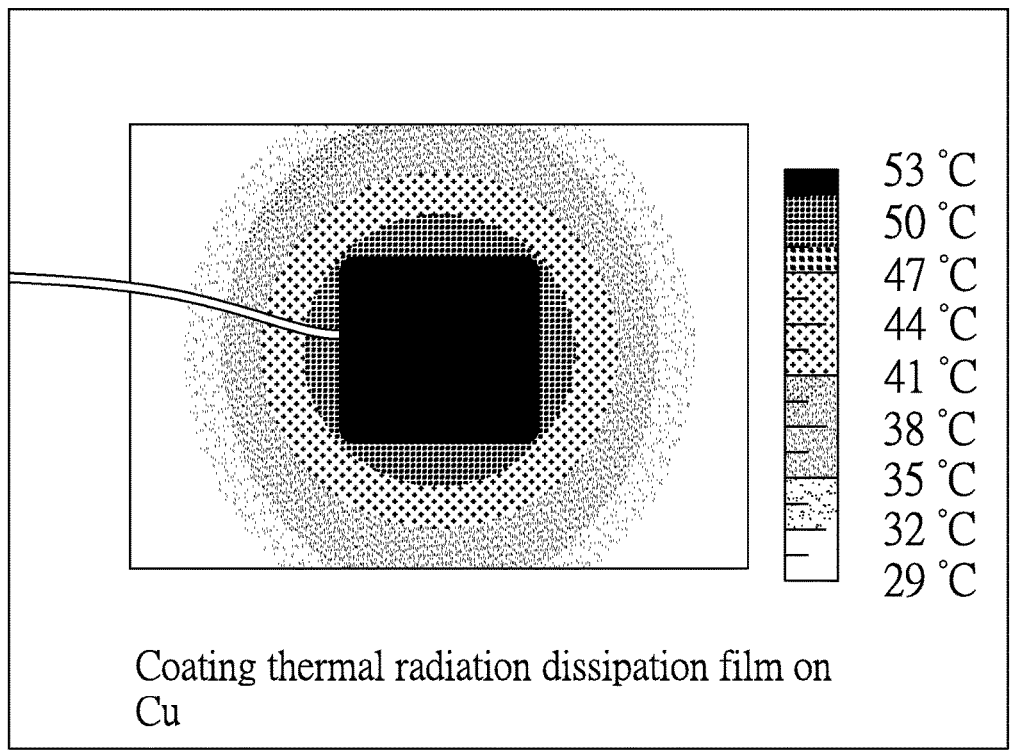
Figure 1:
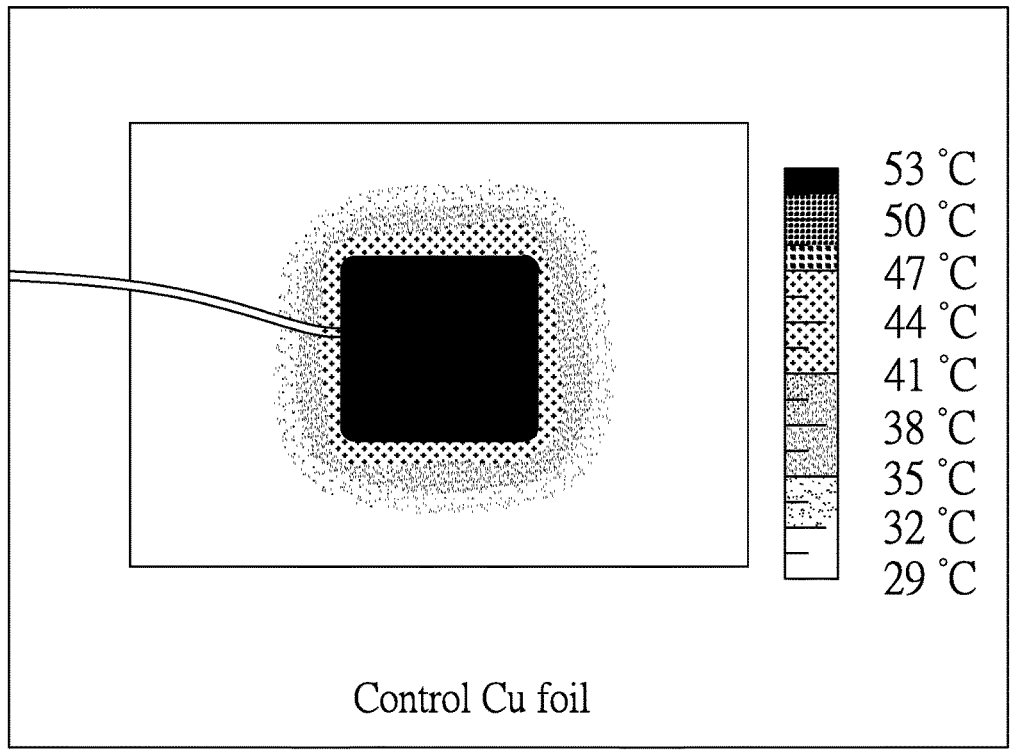
Figure 15:
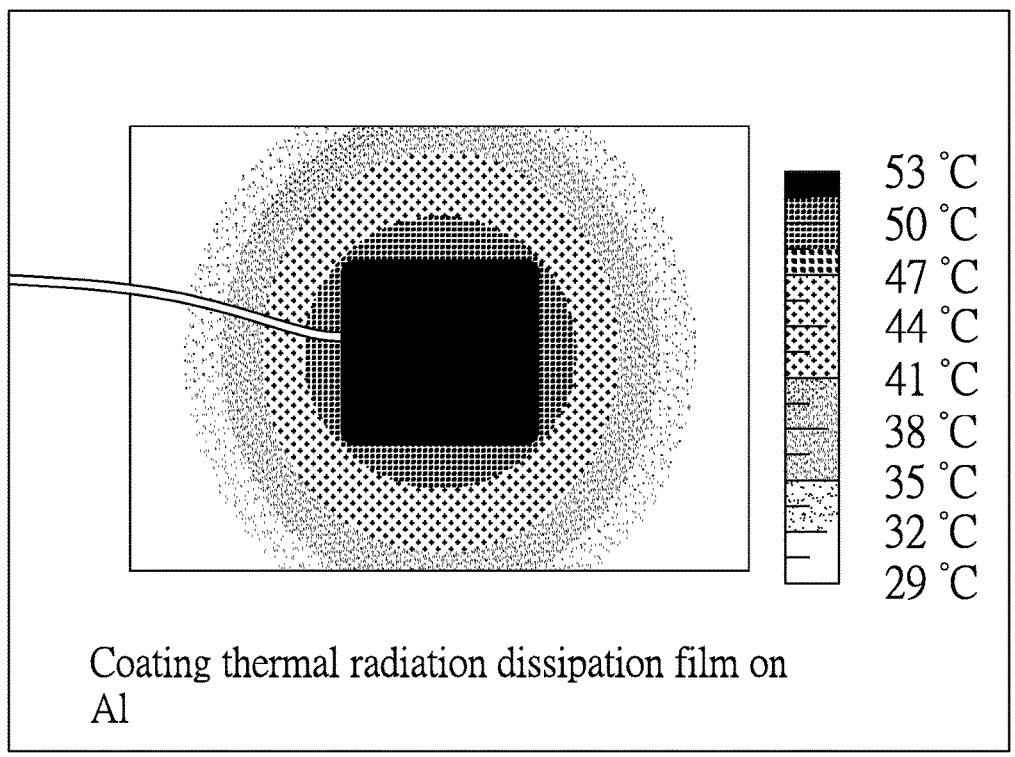
Figure 2:
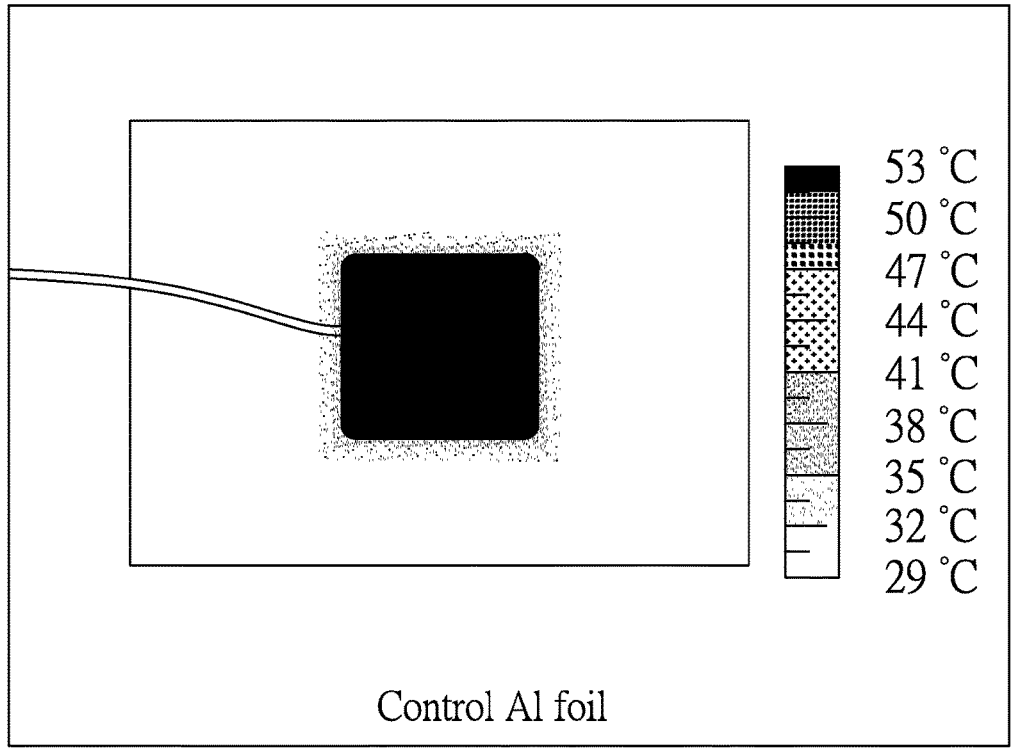
Figure 15:
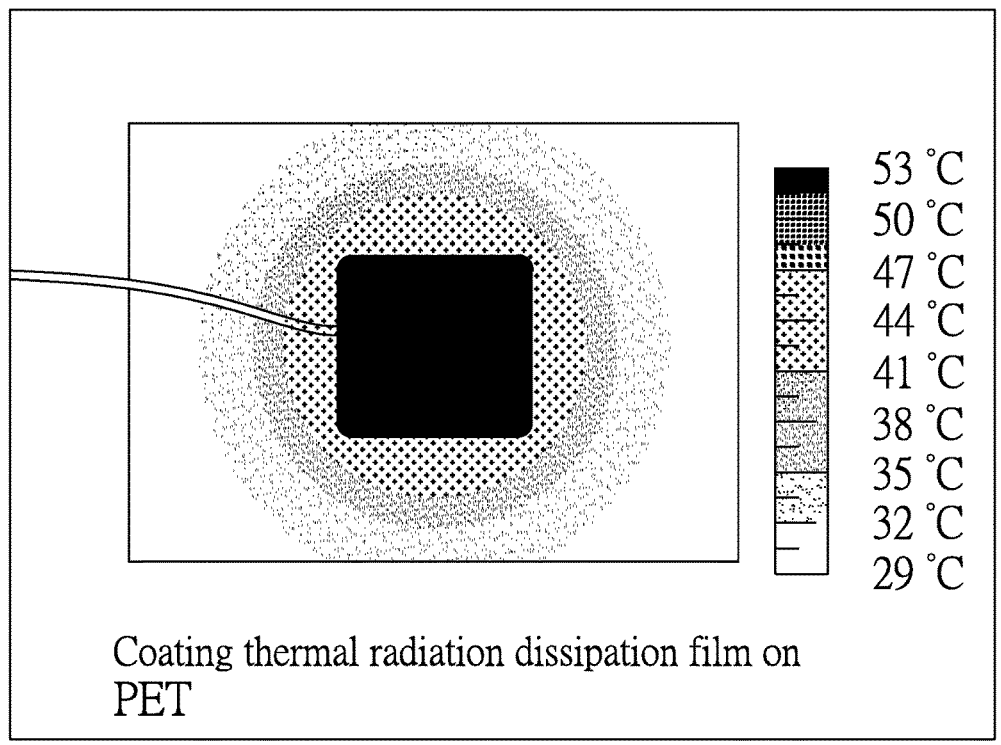
Figure 3:
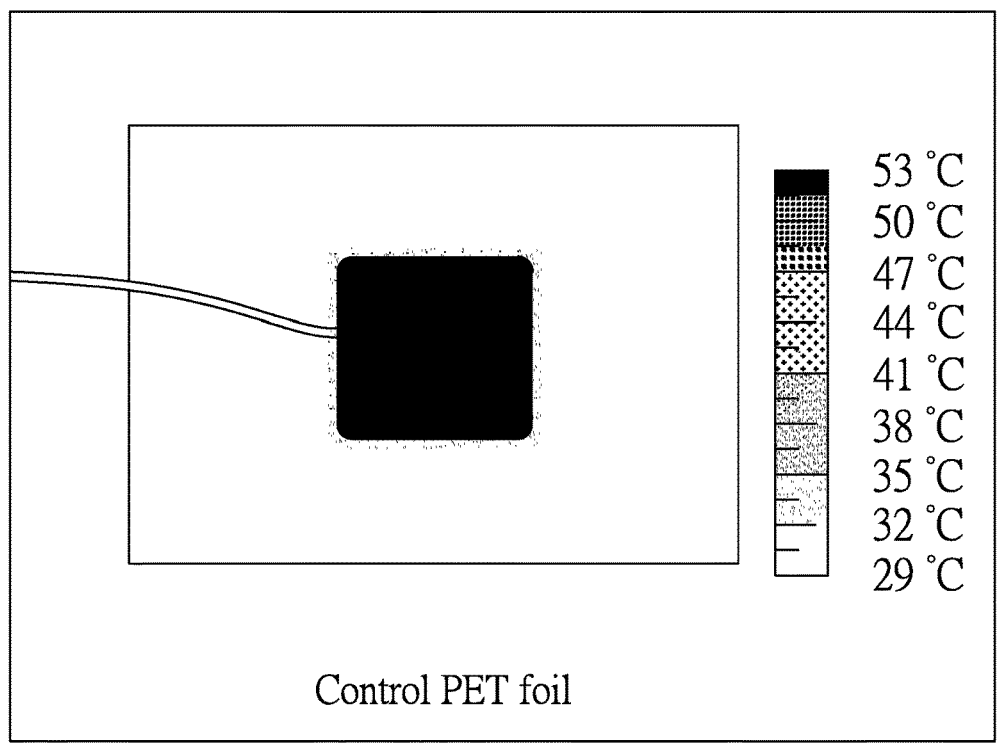

The carbon materials are made of graphene so that the thermal radiation dissipation ink 14 forms a graphene-based thermal radiation dissipation film, thus obtaining brilliant heat dissipation. For example, the graphene-based thermal radiation dissipation film is coated on substrates (as shown in FIGS. 15-1 to 15-3) and temperatures of the substrates 10 are measured respectively, wherein the substrates 10 are made of copper as shown in FIG. 15-1; the substrates 10 are made of aluminum as illustrated in FIG. 15-2; and the substrates 10 are made of PET as shown in FIG. 15-3.

Figure 17:
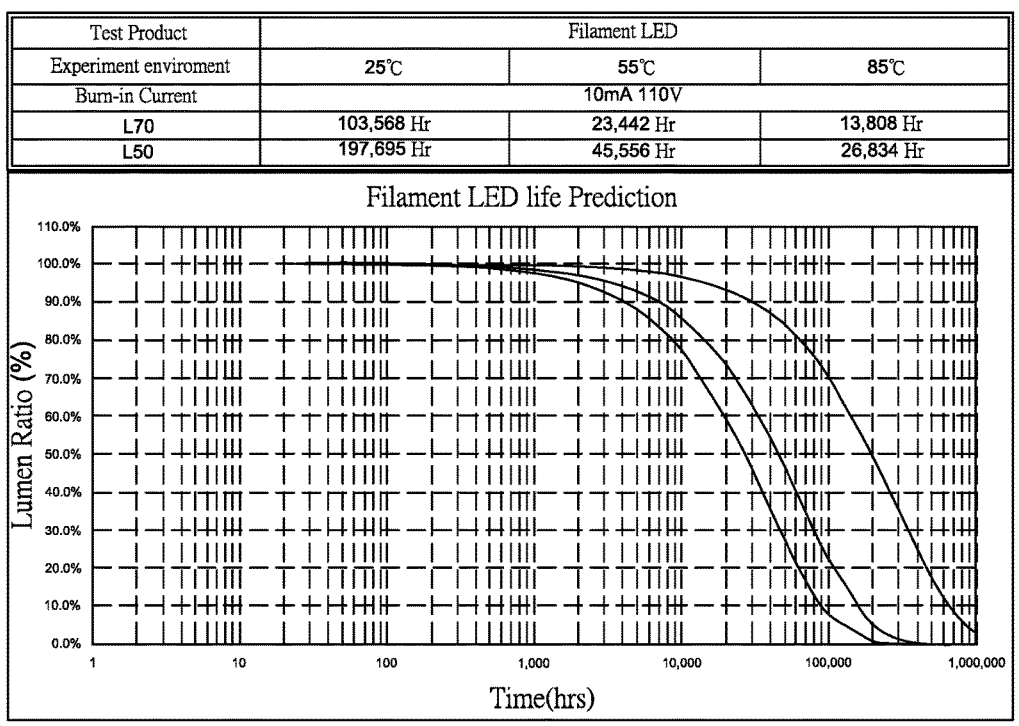
FIG. 17 is a schematic view showing temperatures of the thermal radiation filaments of the present invention reduce 25° C. less than conventional LED filaments after a period of using time.

With reference to FIG. 17, temperatures of the thermal radiation filaments 40 of the present invention reduce 25° C. less than conventional LED filaments after a period of using time. Preferably, the thermal radiation filaments 40 prolong a service life of the LED light bulb 50 effectively.

While the preferred embodiments of the invention have been set forth for the purpose of disclosure, modifications of the disclosed embodiments of the invention as well as other embodiments thereof may occur to skilled in the art. Accordingly, the appended claims are intended to cover all embodiments which do not depart from the spirit and scope of the invention.

What is claimed is:

1. A method of making a LED light bulb with thermal radiation filaments comprising steps of:
   A. providing a substrate which includes multiple conductive portions formed on two ends of the substrate respectively so as to electrically connect with an electronic circuit;
   B. molding LED chips, wires, and phosphors on a front face of the substrate so as to produce a LED filament sheet;
   C. forming a thermal radiation dissipation film on a back face of the substrate before or after producing the LED filament sheet;
   D. cutting the substrate into the thermal radiation filaments, wherein each of the thermal radiation filaments has a part of the thermal radiation dissipation film, a part of the LED filament sheet, and parts of the multiple conductive portions respectively; and
   E. fixing the thermal radiation filaments into the LED light bulb.

2. The method as claimed in claim 1, wherein in the step B has sub-steps of:
   B1. die bonding, wherein the LED chips are die bonded to the front face of the substrate;
   B2. wire bonding, wherein the wires are serially connected with the LED chips and are electrically connected with the multiple conductive portions of the substrate respectively so as to form a serial circuit; and
   B3. forming the phosphors, wherein phosphor glue is coated on the LED chips so as to form the phosphors on the LED chips.

3. The method as claimed in claim 1, wherein phosphor glue is coated on the LED chips and the wires so that the phosphors cover the LED chips and the wires, and the phosphors do not cover the multiple conductive portions of the substrate.

4. The method as claimed in claim 1, wherein the thermal radiation dissipation film is formed on the back face of the substrate by coating thermal radiation dissipation ink on the back face of the substrate.

5. The method as claimed in claim 1, wherein the thermal radiation dissipation film is formed on the back face of the substrate by adhering the thermal radiation dissipation film on the back face of the substrate, and the thermal radiation dissipation film has an adhesive layer.

6. The method as claimed in claim 5, wherein the adhesive layer is thermally conductive adhesive or thermal tape.

7. The method as claimed in claim 1, wherein the substrate is made any one of metal, ceramic, glass, and plastic.

8. The method as claimed in claim 1, wherein the substrate is made any one of metal, flexible ceramic, flexible glass, and plastic.

9. The method as claimed in claim 1, wherein the thermal radiation filaments are fixed into the LED light bulb and are bent at a curvature or in an arc shape.

10. The method as claimed in claim 8, wherein the thermal radiation filaments are fixed into the LED light bulb and are bent at a curvature or in an arc shape.

11. The method as claimed in claim 1, wherein the thermal radiation dissipation film is formed on the back face of the substrate by coating thermal radiation dissipation ink on the back face of the substrate in any one of a spray coating manner, a brushing manner, a screen printing manner, and a nozzle printing manner.

12. The method as claimed in claim 1, wherein the thermal radiation dissipation ink contains dissipation fillers, dispersants, and binders.

13. The method as claimed in claim 12, wherein the dissipation fillers are any one of carbon materials, metal particles, infrared-ray radiation powders, and a mixture of the carbon materials, the metal particles, and the infrared-ray radiation powders.

14. The method as claimed in claim 12, wherein the carbon materials are any one of graphene, carbon black, graphite, carbon nanotubes, activated carbon and a mixture of the graphene, the carbon black, the graphite, the carbon nanotubes, and the activated carbon.

15. The method as claimed in claim 12, wherein the metal particles are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

16. The method as claimed in claim 12, wherein the infrared-ray radiation powders are made of any one of silica ($SiO_2$), alumina ($Al_2O_3$), titanium dioxide ($TiO_2$), zirconia ($ZrO_2$), zirconium carbide (ZrC), silicon Carbide (SiC), tantalum carbide (TaC), titanium diboride ($TiB_2$), zirconium diboride ($ZrB_2$), two titanium silicide ($TiSi_2$), silicon nitride ($Si_3N_4$), titanium nitride (TiN), boron nitride (BN), and a mixture of the $SiO_2$, the $Al_2O_3$, the $TiO_2$, the $ZrO_2$, the ZrC, the SiC, the TaC, the $TiB_2$, the $ZrB_2$, the $TiSi_2$, the $Si_3N_4$, the TiN, and the BN.

\* \* \* \* \*